(12) United States Patent
Nakagawa et al.

(10) Patent No.: US 8,710,724 B2
(45) Date of Patent: Apr. 29, 2014

(54) LED LIGHT SOURCE LAMP HAVING DRIVE CIRCUIT ARRANGED IN OUTER PERIPHERY OF LED LIGHT SOURCE

(71) Applicant: Panasonic Corporation, Osaka (JP)

(72) Inventors: Hiroki Nakagawa, Osaka (JP);
Toshiyuki Namura, Osaka (JP);
Yoshinori Kakuno, Osaka (JP);
Kazushige Sugita, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 14/082,939

(22) Filed: Nov. 18, 2013

(65) Prior Publication Data

US 2014/0071690 A1 Mar. 13, 2014

Related U.S. Application Data

(63) Continuation of application No. 13/574,048, filed as application No. PCT/JP2011/000570 on Feb. 2, 2011, now Pat. No. 8,604,679.

(30) Foreign Application Priority Data

Mar. 4, 2010 (JP) ................................. 2010-048194

(51) Int. Cl.
*F21S 2/00* (2006.01)

(52) U.S. Cl.
USPC ............................. 313/116; 362/485; 362/487

(58) Field of Classification Search
USPC .................. 362/485, 487, 296.01; 257/98–99; 313/116
See application file for complete search history.

(56) References Cited

U.S. PATENT DOCUMENTS

| | | |
|---|---|---|
| 2006/0002104 A1 | 1/2006 | Willis et al. |
| 2009/0268470 A1 | 10/2009 | Okimura et al. |
| 2010/0002444 A1 | 1/2010 | Konaka |
| 2010/0026185 A1 | 2/2010 | Betsuda et al. |
| 2011/0006680 A1 | 1/2011 | Tanaka et al. |
| 2012/0063148 A1 | 3/2012 | Tanaka et al. |
| 2012/0306344 A1 | 12/2012 | Tanaka et al. |
| 2012/0306352 A1 | 12/2012 | Tanaka et al. |
| 2012/0306353 A1 | 12/2012 | Tanaka et al. |
| 2012/0306397 A1 | 12/2012 | Tanaka et al. |
| 2012/0307497 A1 | 12/2012 | Tanaka et al. |

FOREIGN PATENT DOCUMENTS

| | | |
|---|---|---|
| CN | 2462230 | 11/2001 |
| CN | 2851827 | 12/2006 |

(Continued)

OTHER PUBLICATIONS

Search report from E.P.O., mail date is Oct. 1, 2013.

(Continued)

*Primary Examiner* — Tracie Y Green
(74) *Attorney, Agent, or Firm* — Greenblum & Bernstein, P.L.C.

(57) ABSTRACT

An LED light source lamp includes a housing configured to be attached to a lamp holder; an LED module provided in the housing; a drive circuit provided in the housing and configured to drive the LED module to cause the LED module to emit light; an LED installation plate on which the LED module is installed; a cover arranged to block an optical axis of the LED module and configured to transmit light emitted from the LED module; and a separation member configured to separate the drive circuit from a space between the LED module and the cover in the housing. The LED installation plate has a rear surface, opposite the surface on which the LED module is installed. The rear surface is configured to closely contact the lamp holder, and is a part of the housing.

13 Claims, 6 Drawing Sheets

(56) References Cited

FOREIGN PATENT DOCUMENTS

| | | |
|---|---|---|
| CN | 101413650 | 4/2009 |
| CN | 201382304 | 1/2010 |
| JP | 2007-157690 | 6/2007 |
| JP | 2009-080966 | 4/2009 |
| WO | 2009/102003 | 8/2009 |

OTHER PUBLICATIONS

China Office action, dated Aug. 21, 2013 (English translation).
China Office action, dated Feb. 21, 2013 (English language translation).

LED LIGHT SOURCE LAMP HAVING DRIVE CIRCUIT ARRANGED IN OUTER PERIPHERY OF LED LIGHT SOURCE

CROSS-REFERENCE TO RELATED APPLICATION

This is a continuation of pending application of pending U.S. application Ser. No. 13/574,048, having a §371(c) date of Jul. 19, 2012, which is a national stage entry of International Application No. PCT/JP2011/000570, filed Feb. 2, 2011, and which claims priority to Japanese Application No. 2010-048194, filed Mar. 4, 2010. The disclosure of these documents, including the specifications, drawings, and claims, are incorporated by reference in their entireties.

TECHNICAL FIELD

The present disclosure relates to LED light source lamps having a built-in drive circuit, and more specifically, to a technology for obtaining an even light emitting surface.

BACKGROUND ART

In recent years, in association with improvement of semiconductor technologies, there are enhanced demands for LED light source lamps that use solid-state light emitting elements.

The above LED light source lamps cause less power consumption, have long life, and thus greatly contribute to promotion of energy conservation. Therefore, it is expected that such LED light source lamps will explosively prevail in the future.

Here, Patent Literature 1 discloses a conventional thin LED lamp that has a built-in drive circuit.

Meanwhile, there also are great demands for good illumination where an even brightness is realized on the light-emitting surface. However, the area of a light-emitting surface of a solid-state light emitting element is smaller than that of a fluorescent tube or the like, and unevenness of the brightness on the light-emitting surface tends to occur. Therefore, in order to reduce the unevenness, in a general LED light source lamp, a diffusion film is arranged to a side toward which light is emitted from the solid-state light emitting element.

Further, in order to reduce the unevenness of the brightness on the light-emitting surface, and to make the brightness on the light-emitting surface more even, means such as a thicker diffusion film or a higher particle density in a diffusion film may be employed.

PATENT LITERATURE

[PTL 1] Japanese Laid-open Patent Publication No. 2007-157690

SUMMARY OF THE INVENTION

Problems to be Solved by the Invention

However, the more even the brightness on the light-emitting surface is made, the more the light extraction efficiency is reduced, resulting in lower brightness. Thus, there is a demand for obtaining a light-emitting surface having more even brightness, without deteriorating the light extraction efficiency. Further, in the thin LED lamp as in Patent Literature 1, in addition to the fact that the LED lamp is thin, a metal core substrate 6 for mounting a driver circuit and a metal block 7 are arranged on the rear side of an LED 3. Therefore, the distance between the LED 3 and a light-emitting surface covering case 5 (corresponding to the above diffusion film) can hardly be secured. When the distance between the LED and the diffusion film is extremely short as in this case, the effect of the reduced unevenness of the brightness brought by the diffusion film is reduced, the unevenness of the brightness on the light-emitting surface becomes distinctive. Thus, by only using a thicker diffusion film or an increased particle density, it is difficult to make the brightness on the light-emitting surface even.

Moreover, in order to maintain a stable drive condition, there is a demand for further increasing heat dissipation performance.

Therefore, a first object of the present invention is to provide an LED light source lamp that can yield more even light-emitting surface without deteriorating the light extraction efficiency, and a second object of the present invention is to provide an LED light source lamp that can further improve the heat dissipation performance.

Solution to the Problems

The present invention is directed to an LED light source lamp. In order to solve the above problems, the LED light source lamp of the present invention is an LED light source lamp including a built-in drive circuit in a housing thereof and configured to be used by being attached to a lamp holder, the LED light source lamp including: an LED installation plate; an LED module; and a light diffusion member. The LED installation plate is arranged, in a main space in the housing, on an attachment side to the lamp holder. The LED module is installed on a surface, of the LED installation plate, opposite to the lamp holder, and includes at least one LED element that emits light by being driven by the drive circuit. The light diffusion member is arranged so as to block an optical axis of light emitted by each of the at least one LED of the LED module. The drive circuit is arranged in an outer peripheral space, between the LED module and the light diffusion member, so as not to block the optical axis of light emitted by each of the at least one LED of the LED module.

Further, the LED light source lamp may include a separation member configured to separate the drive circuit from a space between the LED module and the light diffusion member to shield thermal radiation from the LED module, and configured to reflect and direct some of light, emitted from the LED module, that does not directly reach the light diffusion member, toward the light diffusion member.

Further, the LED light source lamp may include a reflection diffusion member arranged between the LED module and the light diffusion member so as to block some of the optical axis emitted by each of the at least one LED of the LED module, and configured to reflect and diffuse some of light emitted from the LED module.

Further, in the LED light source lamp, the drive circuit may be arranged in the outer peripheral space, divided in two positions distanced from each other, and may include a primary side power source circuit located at one of the two positions, and a switching transistor located at the other position.

Further, in the LED light source lamp, the LED installation plate may have a rear surface, of the surface on which the LED module is installed, serving as an attachment surface to the lamp holder, and may form a part of the housing.

Further, in the LED light source lamp, the LED installation plate may have a higher thermal conductivity than a member around the attachment surface to the lamp holder.

Further, in the LED light source lamp, when the LED light source lamp is attached to the lamp holder, the LED installation plate may closely contact a thermal conductive member of the lamp holder.

Further, in the LED light source lamp, the drive circuit may further include a power input terminal installed on an area where the LED installation plate is not arranged, and configured to be connected to an external power line when the LED light source lamp is attached to the lamp holder, and the LED installation plate is preferably not connected to an external power line when the LED light source lamp is attached to the lamp holder.

Advantageous Effects of the Invention

As described above, in the present invention, it is possible to secure, to a maximum extent, the distance between the LED module and the light diffusion member in a limited space. Therefore, it is possible to make the brightness at the light diffusion member more even, without hardly any deterioration of the light extraction efficiency.

Further, by the provision of the separation member, it is possible to improve the brightness and make the brightness more even while thermally protecting the drive circuit.

Further, by the provision of the reflection diffusion member, the brightness can be made more even.

Further, by arranging the drive circuit, divided in different positions, electromagnetic induction coupling can be prevented and a noise can be reduced.

Further, since the drive circuit is not located nearer to a lamp holder relative to the LED module, the LED installation plate can be externally exposed.

Further, the LED installation plate has a high thermal conductivity and closely contacts the thermal conductive member of the lamp holder, and thus, heat can be easily dissipated to the exterior via the lamp holder.

DESCRIPTION OF EMBODIMENTS

First Embodiment

<Outline>

A first embodiment is an LED light source lamp, in which an LED light source is installed at a lamp holder side position which is farthest from a light diffusion member in the housing of the LED light source lamp, and in which a drive circuit is arranged in an outer peripheral space, between the light diffusion member and the LED light source.

According to this configuration, it is possible to secure, to a maximum extent, the distance between the drive circuit and the LED light source in a limited space. Thus, it is possible to obtain a more even light-emitting surface, without hardly any deterioration of the light extraction efficiency.

Further, by exposing an installation plate for the LED light source and causing the installation place to closely contact a thermal conductive member of a lamp holder, heat dissipation performance is improved.

<Configuration>

Figure 1:
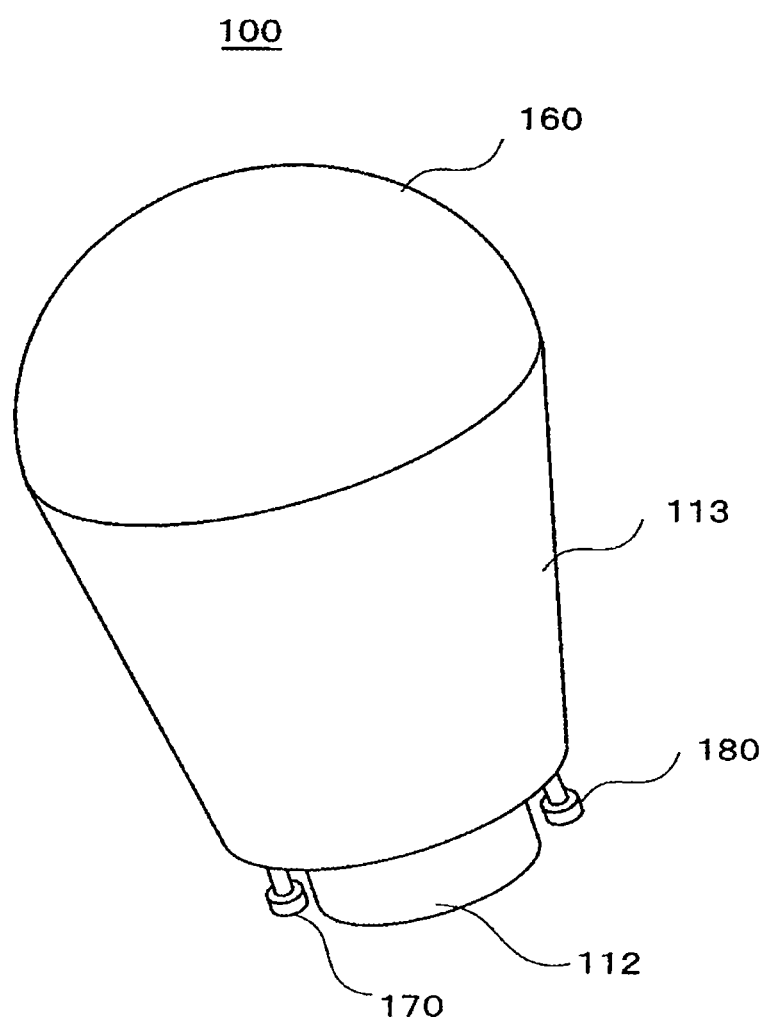
FIG. 1 shows an external view of an LED light source lamp 100 according to a first embodiment.
Figure 2:
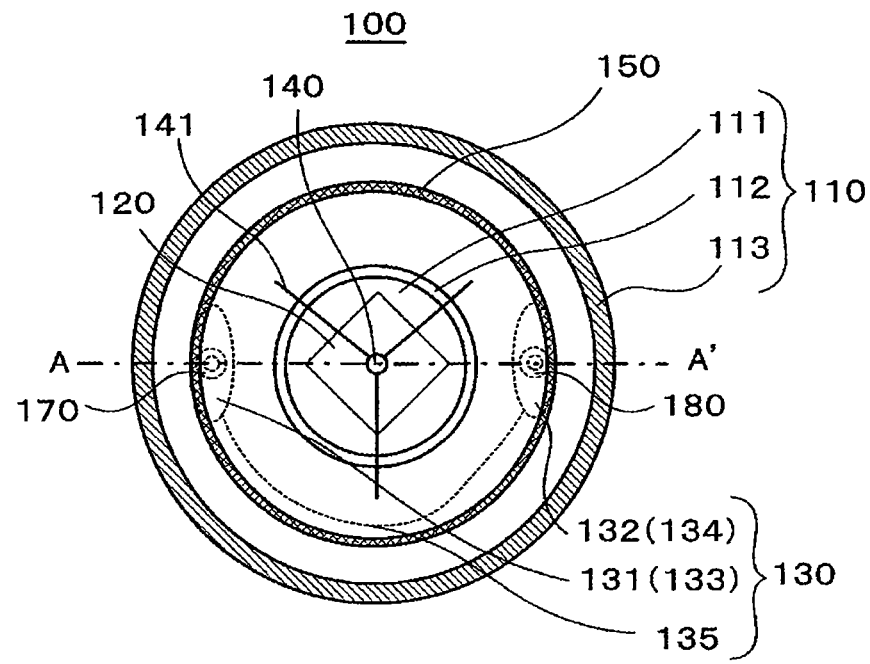
FIG. 2 is a schematic diagram showing a cross section (a B-B' cross section indicated by a two-dot chain line in FIG. 3) in a horizontal direction of the LED light source lamp 100.
Figure 3:
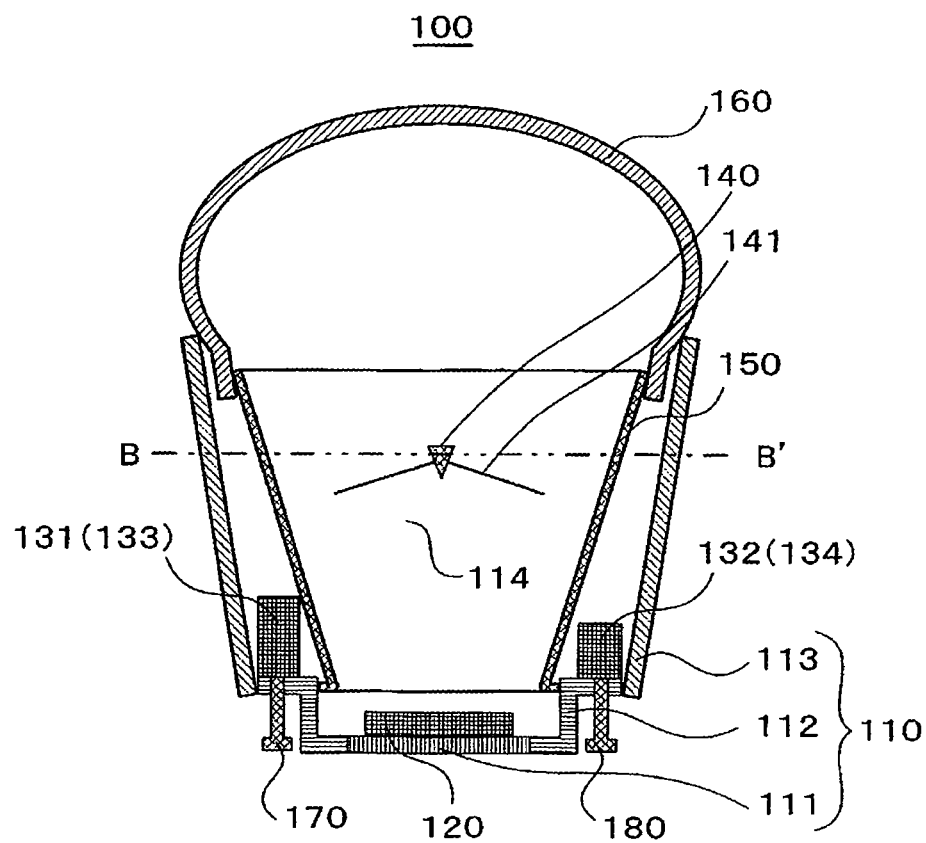
FIG. 3 is a schematic diagram showing a cross section (an A-A' cross section indicated by a chain line in FIG. 2) in a vertical direction of the LED light source lamp 100.

FIG. 1 shows an external view of an LED light source lamp 100 according to a first embodiment. FIG. 2 is a schematic diagram showing a cross section (corresponding to a B-B' cross section indicated by a two-dot chain line in FIG. 3) in a horizontal direction of the LED light source lamp 100. FIG. 3 is a schematic diagram showing a cross section (corresponding to an A-A' cross section indicated by a chain line in FIG. 2) in a vertical direction of the LED light source lamp 100.

As shown in FIGS. 1 to 3, the LED light source lamp 100 according to the first embodiment includes a housing 110, an LED module 120, a drive circuit 130, a reflection diffusion member 140, a separation member 150, a light diffusion member 160, and a power input terminals 170 and 180. The LED module 120, the drive circuit 130, the reflection diffusion member 140, and the separation member 150 are built in the housing 110. The LED light source lamp 100 is used by being attached to a lamp holder.

The present embodiment is directed to an LED light source lamp of a type having a built-in drive circuit in its housing. However, an LED light source lamp of a type not having a built-in drive circuit in its housing can be created. In order to use an LED light source lamp of a type not having a built-in drive circuit, the LED light source lamp has to include a drive circuit on its external apparatus side. However, since development of LED light source lamps are being rapidly advanced, specifications of drive circuits may be frequently changed. Thus, it is not realistic to frequently change the specification of a drive circuit to be provided on the external apparatus side. Moreover, there also are demands to change LED light source lamps among those having different outputs and shapes, in accordance with the feeling of the user or circumstances. Thus, it is more convenient and advantageous to cause a drive circuit to be built in an LED light source lamp.

The housing 110 is a case formed by joining an LED installation plate 111, a power supply terminal installation part 112, and a lateral heat dissipation part 113. A lower side surface of the LED light source lamp 100 shown in FIG. 2 serves as an attachment surface to a lamp holder of an external apparatus.

The LED installation plate 111 is a disc-like aluminum plate arranged, in a main space 114 which is a largest space in the housing 110, on the side where the LED light source lamp 100 is to be attached to a lamp holder of an external apparatus. The LED module 120 is installed on a surface, of the LED installation plate 111, opposite to the lamp holder. In the present embodiment, a rear surface of the surface of the LED installation plate 111 on which the LED module 120 is installed serves as an attachment surface to a lamp holder of an external apparatus, and the LED installation plate 111 forms a part of the housing 110. It is preferable that the LED installation plate 111 is formed of a material having a generally high thermal conductivity, in order to effectively dissipate heat to the exterior via a lamp holder of an external apparatus. In the present embodiment, the material forming the LED installation plate 111 is aluminum which is generally considered as having a high thermal conductivity. However, the present invention is not limited thereto. Preferably, the material of the LED installation plate 111 is a material having a higher thermal conductivity than the power supply terminal installation part 112. For example, the material of the LED installation plate 111 may be iron or copper; a metal such as an alloy containing iron, copper, and/or aluminum; or a non-metallic material having a superior thermal resistance such as ceramics. Further, the LED installation plate 111 may not form a part of the housing 110, and instead, the LED installation plate 111 may be installed in the housing 110, separately from the housing 110.

The power supply terminal installation part 112 is, for example, a molded product made of resin, arranged around the LED installation plate 111 on the attachment surface to a lamp holder of an external apparatus. The power input terminals 170 and 180 are installed on the power supply terminal installation part 112, the power input terminals 170 and 180 being configured to be connected to an exterior power line when the of the LED installation plate 111 is attached to the lamp holder.

The lateral heat dissipation part 113 is a structure whose outer shape is a substantially circular truncated cone, which is manufactured by, for example, joining a rectangular aluminum flat plate to have an annular shape and then press-forming the annular-shaped aluminum plate, or by press-forming a doughnut-shaped aluminum flat plate. The lateral heat dissipation part 113 dissipates, from its lateral surface into the air, waste heat generated from the drive circuit 130 and the like.

The LED module 120 is a collection of LEDs used for illumination, provided in a unit of a plurality of LEDs which emit light by being driven by the drive circuit 130. The LED module 120 is installed on a side, of the LED installation plate 111, opposite to a lamp holder of an external apparatus, that is, on a surface (upper surface in FIG. 2) facing the main space 114 side in the housing 110.

Here, the LED module 120 may be implemented in either of a form in which LED elements (bare chips) are primary-mounted on a module substrate and a form in which LED elements accommodated in a package are secondary-mounted on a module substrate.

Further, the module substrate preferably has a high thermal conductivity. For example, a ceramic substrate, a metal substrate, a semiconductor substrate using Si or the like, a glass substrate, a glass epoxy substrate, or the like can be used.

It should be noted that at least one LED element may be provided in the LED module 120. Further, each LED element may the one that emits monochromatic light such as red, green, or blue. In an LED module provided with a plurality of LED elements having different luminescent colors, it is possible to obtain a wide light color range including white, by changing the output balance of monochromatic lights.

Further, the LED module 120 may be implemented by an LED element and a wavelength conversion member. For example, the LED module 120 may be a white LED combined with a YAG phosphor.

Further, the LED module 120 may be implemented in a form in which a wavelength conversion member is installed on a module substrate on which LED elements are primary-mounted, or a form in which LED elements and a phosphor accommodated in a package are secondary-mounted on a module substrate.

Further, white LEDs having different color temperatures may be appropriately combined. Further, the color tone may be changed on the blackbody locus.

Figure 4:
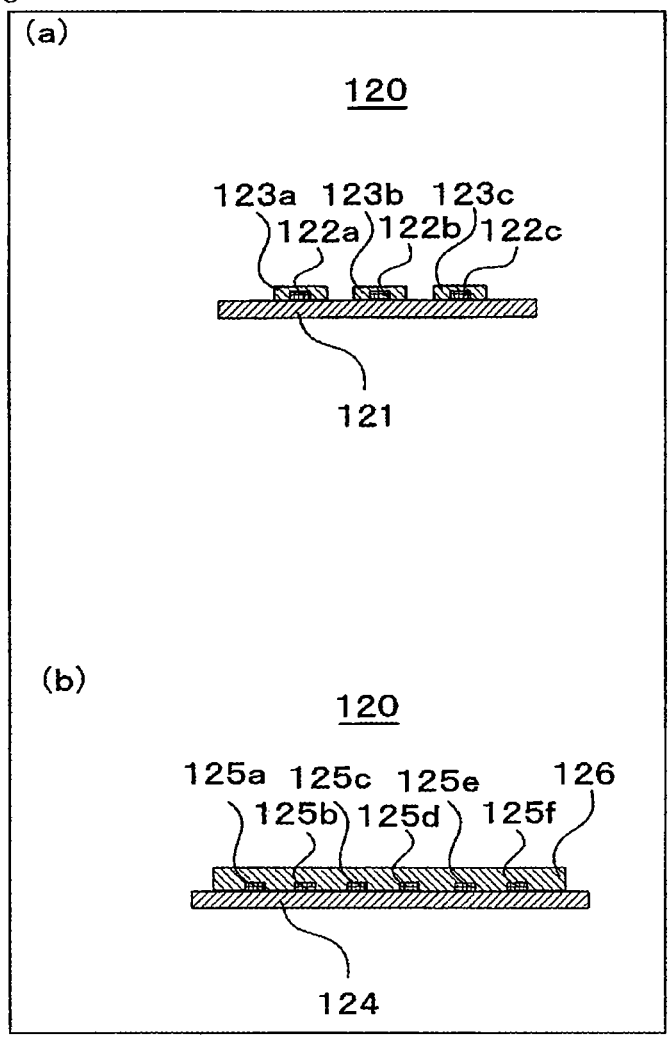
In FIG. 4, (a) shows a cross section of a configuration in which LED elements are sealed with wavelength conversion members, respectively, and (b) shows a cross section of a configuration in which a plurality of LED elements are collectively sealed with a wavelength conversion member.

As shown in the cross section in FIG. 4 (*a*), the LED module 120 may be implemented in a form in which a plurality of LED elements 122*a* to 122*c* are installed on a module substrate 121 and the LED elements 122*a* to 122*c* are sealed with wavelength conversion members 123*a* to 123*c*, respectively, which are each made of silicone resin or the like with a YAG phosphor or the like dispersed therein. Alternatively, as shown in a cross section in FIG. 4 (*b*), the LED module 120 may be implemented in a form in which a plurality of LED elements 125*a* to 125*f* installed on a module substrate 124 are collectively sealed with a wavelength conversion member 126. In the form where the LED elements are collectively sealed to form one flat surface as shown in FIG. 4 (*b*), diffused light is emitted. Therefore, the present invention can attain a more advantageous effect.

Figure 5:
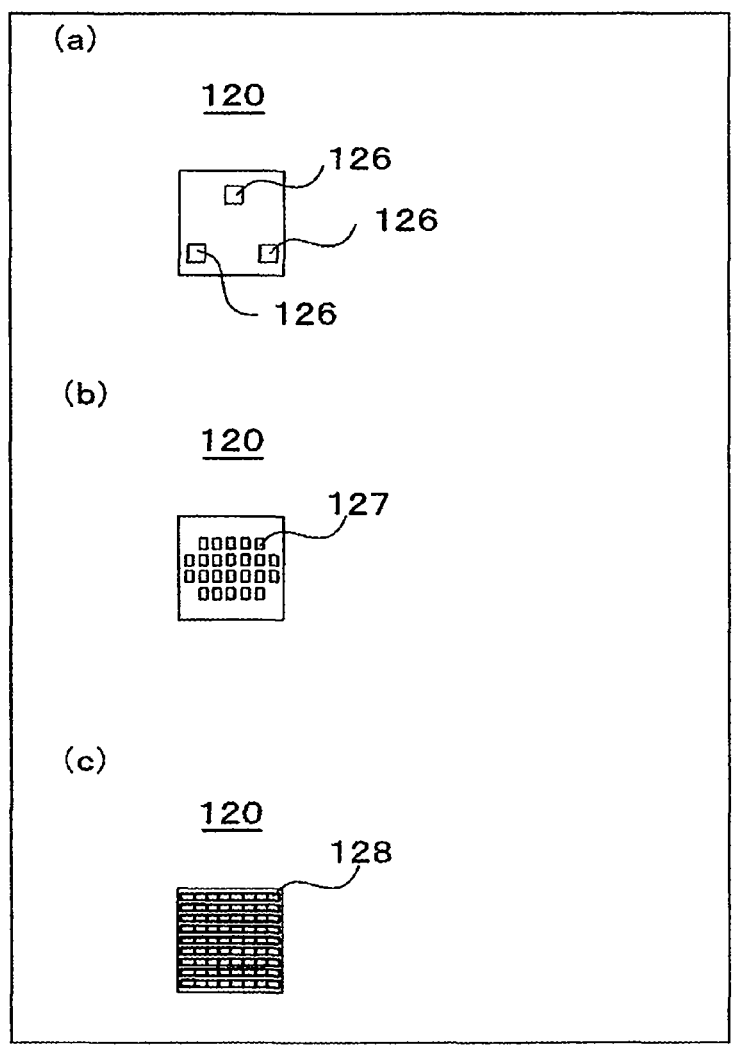
In FIG. 5, each of (a) to (c) shows a specific example of how to arrange LED elements in an LED module 120.

Each of (*a*) to (*c*) of FIG. 5 shows a specific example of how to arrange LED elements in the LED module 120.

As shown in FIG. 5 (*a*), for example, high-brightness three LEDs 127 are arranged on the LED module 120, in a triangle shape with an interval of approximately 5 to 15 mm therebetween. As shown in FIG. 5 (*b*), for example, relatively-high-brightness 22 LEDs 128 are two-dimensionally arranged on the LED module 120. As shown in FIG. 5 (*c*), for example, small 72 LEDs 129 are two-dimensionally and densely arranged on the LED module 120, in a quadrangle shape having approximately 10 to 15 mm dimensions.

The drive circuit 130 is an electronic circuit that outputs a power appropriate for lighting the LED module 120. The drive circuit 130 is arranged in an outer peripheral space, between the LED module 120 and the light diffusion member 160, so as not to block, in the main space 114 in the housing 110, the optical axis of light emitted by each LED on the LED module 120. Further, the drive circuit 130 is an electronic circuit for causing the LED module 120 to emit light. For example, in a case where a general household power source (AC100V or AC200V) is used as an input, the drive circuit 130 includes a primary side circuit element 131 such as a rectification diode, an inductor, or the like, and a switching transistor 132. Further, for example, in a case where a DC power source (DC6V, 12V, 24V, or the like) is used as an input, the drive circuit 130 includes a primary side circuit element 133 such as a capacitor, an inductor, or the like, and a switching transistor 134.

Here, in the present embodiment, in order to prevent electromagnetic induction coupling and to reduce a noise, the drive circuit 130 is arranged, divided in two positions distanced from each other as shown in FIG. 2 and FIG. 3. For example, in the case of a general household power source, the primary side circuit element 131 is located in one position in the outer peripheral space, and the switching transistor 132 is located in the other position. Moreover, for example, in the case of a DC power source, the primary side circuit element 133 is located in one position in the outer peripheral space and the switching transistor 134 is located in the other position.

Further, when a twisted wire 135 is used to connect the components of the drive circuit 130 which are arranged, divided in the respective two positions, a further noise reduction effect can be expected.

It should be noted that, with respect to the drive circuit 130, the components thereof are arranged, divided in two positions distanced from each other, and use of a twisted wire to connect the components are not necessarily required. Even without these configurations, the objects of the present invention can be achieved.

The reflection diffusion member 140 has, for example, a cone shape or a pyramid shape, and is made of a material having a high reflectance such as a mirror finished stainless steel or a plated steel. The reflection diffusion member 140 is arranged, supported by a support bar 141 or the like in the hollow space between the LED module 120 and the light diffusion member 160, so as to block some of the optical axis of light emitted by each LED of the LED module 120, thereby reflecting and diffusing some of light emitted from the LED module.

The separation member 150 is a member having an enhanced reflectance by, for example, depositing aluminum on a surface of a molded resin. The separation member 150 separates the drive circuit 130 from the space between the reflection diffusion member 140 and the light diffusion member 160, to shield thermal radiation from the LED module 120 to the drive circuit 130, and reflects and directs some of light, emitted from the LED module 120, that does not directly reach the light diffusion member 160 and light reflected by the reflection diffusion member 140, toward the light diffusion member 160.

It should be noted that the reflection diffusion member 140 and the separation member 150 are not necessarily required components. Even without these components, the objects of the present invention can be achieved.

The light diffusion member 160 is a glass cover on which a diffusion film is formed that diffuses light passing therethrough into various directions, to reduce unevenness of the brightness. The light diffusion member 160 is arranged so as to block the optical axis of light emitted by each LED of the LED module 120 and so as to close the openings of the lateral heat dissipation part 113 and the separation member 150.

It should be noted that the light diffusion member 160 may be implemented in a form in which a diffusion film is formed on an inner wall of a glass bulb, the diffusion film being formed of: fine particles of an inorganic material such as calcium carbonate, silicon dioxide, aluminium oxide, titanium oxide, or the like; or being formed of fine particles of an organic material such as a polymer, or the like, or may be implemented in a form in which the above fine particles are dispersed on an acrylic resin, a polycarbonate resin, a silicone resin, or the like.

The power input terminals 170 and 180 are each a terminal through which power is supplied from a power source, and also serves as a stopper when the LED light source lamp 100 is attached to a lamp holder of an external apparatus.

<Summary>

As described above, in the LED light source lamp of the present embodiment, an LED module is installed, in the space in its housing, to a side nearer to a lamp holder of an external apparatus, and a drive circuit, which has conventionally been located nearer to the lamp holder than the LED module, is located to the light diffusion member side relative to the LED module, and is located in an outer peripheral space so as not to block optical axes. Therefore, it is possible to secure, to a maximum extent, the distance between the LED module and the light diffusion member in the limited space.

If it is possible to have a long distance between the LED module and the light diffusion member as described above, it is possible to make the brightness at the light diffusion member (light-emitting surface) more even, without hardly any deterioration of the light extraction efficiency.

Furthermore, according to be above configuration, the distance between the LED module and the light diffusion member can be secured, and thus, a space in which the reflection diffusion member is arranged can be secured. The reflection diffusion member, which is arranged so as to block some of the optical axes, reflects and diffuses some of light that was to advance toward a high-brightness portion, whereby the brightness at the light diffusion member (light-emitting surface) can be made more even.

Furthermore, the separation member separates the drive circuit arranged in an outer peripheral space, so as to shield thermal radiation from the LED module, and reflects and directs light that is to spread into directions other than toward the light diffusion member, toward the light diffusion member. Accordingly, it is possible to improve the brightness and make the brightness more even while thermally protecting the drive circuit.

Further, since the drive circuit is not located nearer to a lamp holder relative to the LED module, the LED installation plate can be externally exposed, and thus, heat can be easily dissipated to the exterior via the lamp holder.

First Modification

<Outline>

In a first modification, when an LED light source lamp is attached to a lamp holder of an external apparatus, the LED installation plate is pushed by an elastic body such as a blade spring, a coil spring, a rubber, or the like, against a thermal conductive member of the lamp holder; or alternatively, one of the LED installation plate and the thermal conductive member is implemented as a magnet, and the other is implemented as a material that is attracted by a magnet, such as iron or the like, whereby the LED installation plate closely contacts the thermal conductive member of the lamp holder. Accordingly, the heat dissipation performance is further improved.

<Configuration>

Each of FIGS. 6 to 9 is a schematic diagram of a cross section showing, when the LED light source lamp is attached to the lamp holder, how an LED installation plate closely contacts a thermal conductive member of a lamp holder of an external apparatus.

Here, in the first modification, an implementation is assumed that employs a lamp using a GX53 base conforming to the IEC standard described in Patent Literature 1, or a thin LED light source lamp using a base that is similar to said base but conforms to another standard. Moreover, in FIGS. 6 to 9, components that have similar functions of components of the LED light source lamp 100 of the first embodiment are denoted by the same reference characters. In the first embodiment, the housing 110 is a case formed by joining the LED installation plate 111, the power supply terminal installation part 112, and the lateral heat dissipation part 113. However, in the present modification, a part of the separation member 150 also serves as a housing, and thus, the housing 110 is a case formed by joining the LED installation plate 111, the power supply terminal installation part 112, the lateral heat dissipation part 113, and the separation member 150.

Figure 6:
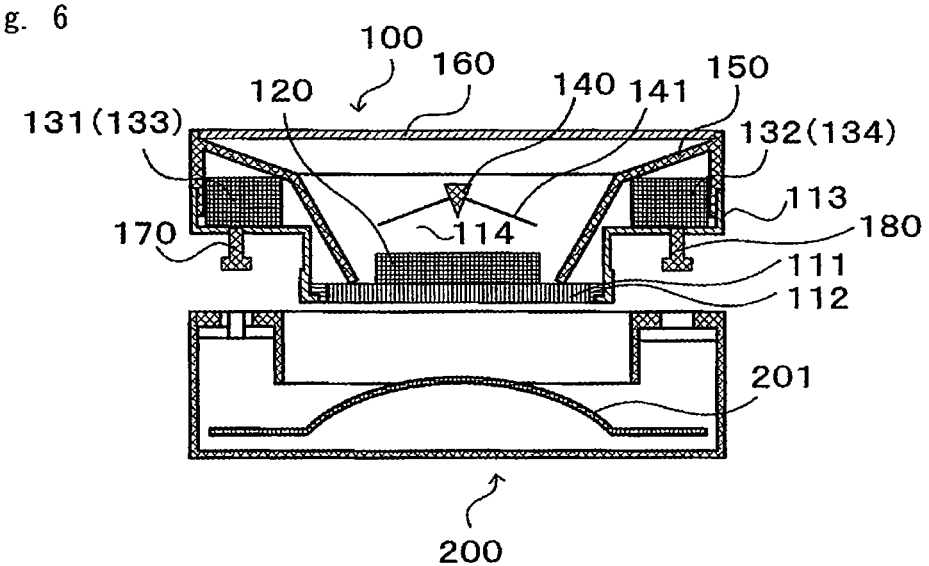
FIG. 6 is a schematic diagram of a cross section showing, in a case where a lamp holder 200 of an external apparatus includes a blade spring, how an LED installation plate closely contacts a thermal conductive member of the lamp holder.

FIG. 6 is a schematic diagram of a cross section showing, in a case where a lamp holder 200 of an external apparatus includes a blade spring, how the LED installation plate closely contacts a thermal conductive member of the lamp holder.

In the example shown in FIG. 6, when the LED light source lamp 100 is attached to the lamp holder 200 of the external apparatus, a blade spring 201 included in the lamp holder 200 closely contacts the LED installation plate 111 under the elasticity of the blade spring 201. Here, the blade spring 201 has a relatively high thermal conductivity, and further, is connected to an external member having a large thermal capacity or a component having a high heat dissipation performance so as to be able to sufficiently conduct heat thereto, thereby serving as a thermal conductive member.

Figure 7:
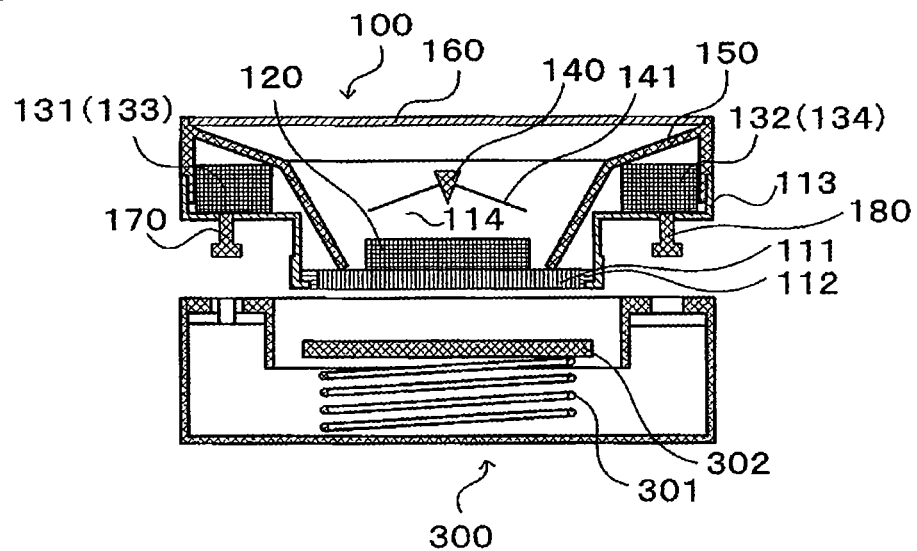
FIG. 7 is a schematic diagram of a cross section showing, in a case where a lamp holder 300 of an external apparatus includes a coil spring, how an LED installation plate closely contacts a thermal conductive member of the lamp holder.

FIG. 7 is a schematic diagram of a cross section showing, in a case where a lamp holder 300 of an external apparatus includes a coil spring, how an LED installation plate closely contacts a thermal conductive member of the lamp holder.

In the example shown in FIG. 7, when the LED light source lamp 100 is attached to the lamp holder 300 of the external apparatus, a thermal conductive member 302 having a coil spring 301 included in the lamp holder 300 closely contacts the LED installation plate 111 under the elasticity of the coil spring 301. Here, as in the case of the blade spring 201, the thermal conductive member 302 has a relatively high thermal conductivity, and further, is connected to an external member having a large thermal capacity or a component having a high heat dissipation performance so as to be able to sufficiently conduct heat thereto.

Figure 8:
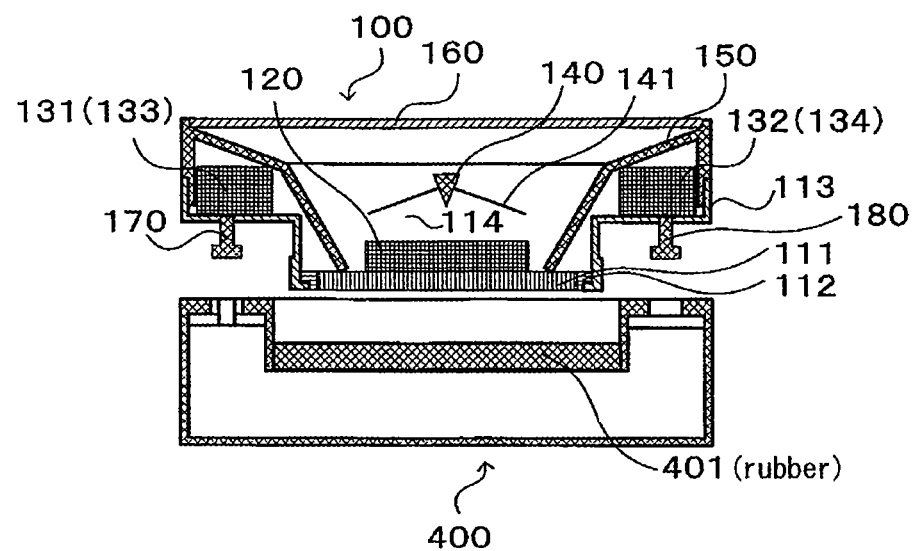
FIG. 8 is a schematic diagram of a cross section showing, in a case where a lamp holder 400 of an external apparatus includes a rubber, how an LED installation plate closely contacts a thermal conductive member of the lamp holder.

FIG. 8 is a schematic diagram of a cross section showing, in a case where a lamp holder 400 of an external apparatus includes a rubber, how an LED installation plate closely contacts a thermal conductive member of the lamp holder.

In the example shown in FIG. 8, when the LED light source lamp 100 is attached to the lamp holder 400 of the external apparatus, a rubber 401 included in the lamp holder 400 closely contacts the LED installation plate 111 under the elasticity of the rubber 401. Here, as in the case of the blade spring 201, the rubber 401 has a relatively high thermal conductivity, and further, is connected to an external member having a large thermal capacity or a component having a high heat dissipation performance so as to be able to sufficiently heat thereto, thereby serving as a thermal conductive member.

Figure 9:
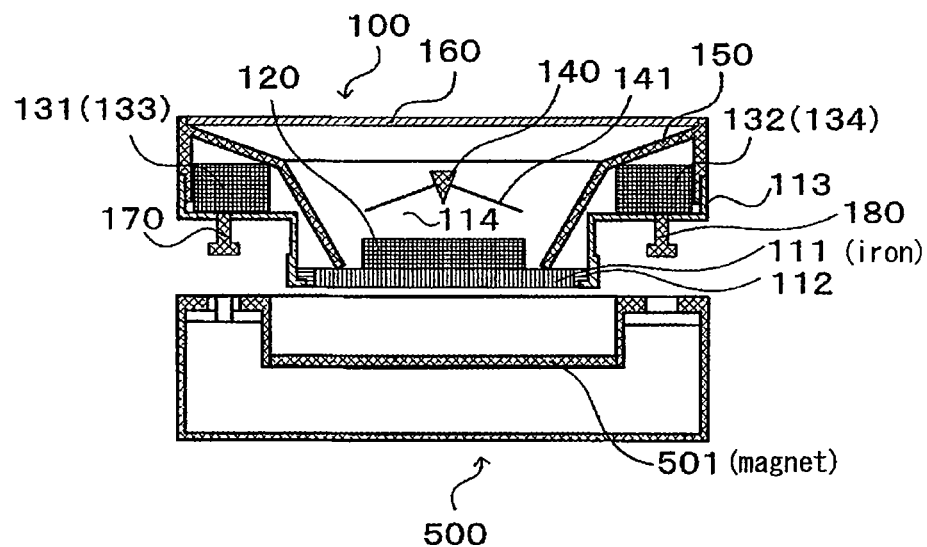
FIG. 9 is a schematic diagram of a cross section showing, in a case where a lamp holder 500 of an external apparatus includes a magnet, how an LED installation plate closely contacts a thermal conductive member of the lamp holder.

FIG. 9 is a schematic diagram of a cross section showing, in a case where a lamp holder 500 of an external apparatus includes a magnet, how an LED installation plate closely contacts a thermal conductive member of lamp holder.

In the example shown in FIG. 9, the LED installation plate 111 is made of iron, and when the LED light source lamp 100 is attached to the lamp holder 500 of the external apparatus, a magnet 501 included in the lamp holder 500 closely contacts the LED installation plate 111 under the magnetic force of the magnet 5011. Here, as in the case of the blade spring 201, the magnet 501 has a relatively high thermal conductivity, and further, is connected to an external member having a large thermal capacity or a component having a high heat dissipation performance so as to be able to sufficiently conduct heat thereto, thereby serving as a thermal conductive member.

In a case where the material of the LED installation plate 111 is a conductive material, when the LED light source lamp 100 is attached to a lamp holder of an external apparatus, the LED installation plate 111 may also serve as a power input terminal by being connected to an external power line. However, it is anticipated that the temperature of the LED installation plate 111 will become higher than an ordinary input terminal, and as the temperature increases, the electrical resistance also increases. Therefore, it is preferable that the LED installation plate 111 is not configured to be connected to an external power line when the LED light source lamp 100 is attached to the lamp holder, and is not configured to also serve as a power input terminal.

<Summary>

As described above, according to the configurations of the present modification, when the LED light source lamp is attached to a lamp holder of an external apparatus, the LED installation plate closely contacts the thermal conductive member of the lamp holder. Therefore, the heat dissipation performance can be further improved.

INDUSTRIAL APPLICABILITY

The LED light source lamp of the present invention can make the brightness at the light diffusion member more even, without hardly any deterioration of the light extraction efficiency, and thus, can be applied to any lighting apparatus such as general household illumination, outdoor lights, and the like. In particular, the LED light source lamp of the present invention causes less power consumption and has longer life, and provides good illumination having even brightness at the light-emitting surface. Therefore, the LED light source lamp of the present invention is highly valuable in terms of the industrial applicability.

DESCRIPTION OF THE REFERENCE CHARACTERS

100 LED light source lamp
110 housing
111 LED installation plate
112 power supply terminal installation part
113 lateral heat dissipation part
120 LED module
121 module substrate
122 LED element
123 wavelength conversion member
124 module substrate
125 LED element
126 wavelength conversion member
127 LED
128 LED
129 LED
130 drive circuit
131 primary side circuit element
132 switching transistor
133 primary side circuit element
134 switching transistor
135 twisted wire
140 reflection diffusion member
150 separation member
160 light diffusion member
170 power input terminal
180 power input terminal
200 lamp holder
201 blade spring
300 lamp holder
301 coil spring
302 thermal conductive member
400 lamp holder
401 rubber
500 lamp holder
501 magnet

The invention claimed is:

1. An LED light source lamp configured to be used by being attached to a lamp holder, the LED light source lamp comprising:

a housing configured to be attached to the lamp holder;
an LED module provided in the housing;
a drive circuit provided in the housing and configured to drive the LED module to cause the LED module to emit light;
an LED installation plate on which the LED module is installed;
a cover arranged so as to block an optical axis of the LED module and configured to transmit light emitted from the LED module; and
a separation member configured to separate the drive circuit from a space between the LED module and the cover in the housing, wherein
the LED installation plate has a rear surface, opposite the surface on which the LED module is installed, the rear surface being configured to closely contact the lamp holder, and comprising a part of the housing.

2. The LED light source lamp according to claim 1, wherein
the drive circuit is positioned in an outer peripheral space, between the LED module and the cover, in the housing and on a cover side relative to the LED module.

3. The LED light source lamp according to claim 1, wherein
the drive circuit includes a power input terminal configured to be connected to an external power line when the LED light source lamp is attached to the lamp holder, and
the power input terminal is on a power supply terminal installation part positioned around the LED installation plate.

4. The LED light source lamp according to claim 1, wherein
the separation member reflects and directs a part of light, emitted from the LED module, that is not directly incident onto the cover, toward the cover.

5. The LED light source lamp according to claim 1, further comprising a reflection diffusion member in the space between the LED module and the cover in the housing and configured to reflect and diffuse a part of light emitted from the LED module.

6. The LED light source lamp according to claim 1, wherein
the drive circuit includes a primary side power source circuit and a switching transistor,
the primary side power source circuit and the switching transistor are positioned in an outer peripheral space, between the LED module and the cover, in the housing and at positions spaced from each other.

7. The LED light source lamp according to claim 1, wherein
the LED installation plate has a higher thermal conductivity than a member provided around the rear surface of the LED installation plate.

8. The LED light source lamp according to claim 1, wherein
when the LED light source lamp is attached to the lamp holder, the LED installation plate closely contacts a thermal conductive member of the lamp holder.

9. A lighting apparatus comprising:
the LED light source lamp according to claim 1; and
a lamp holder to which the LED light source lamp is attached, wherein
the lamp holder includes:
a thermal conductive member; and
an elastic deformation body configured to elastically deform to cause the thermal conductive member to closely contact the rear surface of the LED installation plate when the LED light source lamp is attached to the lamp holder.

10. The lighting apparatus according to claim 9, wherein
the elastic deformation body is a blade spring serving also as the thermal conductive member, and
the blade spring elastically deforms to closely contact the rear surface of the LED installation plate when the LED light source lamp is attached to the lamp holder.

11. The lighting apparatus according to claim 9, wherein the elastic deformation body is a coil spring.

12. The lighting apparatus according to claim 9, wherein the elastic deformation body is a rubber member.

13. A lighting apparatus comprising:
the LED light source lamp according to claim 1; and
a lamp holder to which the LED light source lamp is attached, wherein
the lamp holder includes a thermal conductive member configured to closely contact the rear surface of the LED installation plate when the LED light source lamp is attached to the lamp holder, and
at least one of the LED installation plate and the thermal conductive member is a magnet, and the other is a material that is attracted by the magnet.

* * * * *